US012428338B2

(12) United States Patent
Shibata et al.

(10) Patent No.: US 12,428,338 B2
(45) Date of Patent: Sep. 30, 2025

(54) MICROFABRICATION METHOD

(71) Applicant: DEXERIALS CORPORATION, Tokyo (JP)

(72) Inventors: Akihiro Shibata, Miyagi (JP); Naoto Kaneko, Tochigi (JP); Tsunemoto Kuriyagawa, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 17/592,980

(22) Filed: Feb. 4, 2022

(65) Prior Publication Data

US 2022/0153638 A1    May 19, 2022

Related U.S. Application Data

(63) Continuation of application No. 14/417,466, filed as application No. PCT/JP2013/070383 on Jul. 26, 2013, now Pat. No. 11,242,284.

(30) Foreign Application Priority Data

Jul. 26, 2012 (JP) .................................. 2012-165835
Jun. 7, 2013 (JP) .................................. 2013-120978
(Continued)

(51) Int. Cl.
*C23C 14/00* (2006.01)
*C03C 3/06* (2006.01)
(Continued)

(52) U.S. Cl.
CPC .............. *C03C 23/0025* (2013.01); *C03C 3/06* (2013.01); *C03C 17/02* (2013.01); *C03C 17/245* (2013.01);
(Continued)

(58) Field of Classification Search
CPC ................................. C23C 14/00; H01L 31/00
See application file for complete search history.

(56) References Cited

U.S. PATENT DOCUMENTS 3,670,259 A * 6/1972 Young .................... H01S 3/123
                                                           372/15
5,914,151 A * 6/1999 Usuki ................... G11B 5/8408
                                                           427/128
(Continued)

FOREIGN PATENT DOCUMENTS

CN         101149562 A    3/2008
JP        2002-028799 A    1/2002
(Continued)

OTHER PUBLICATIONS

"Femtosecond laser-induced periodic surface structures", J. Bonse, J. Kruger, S. Hohm and A. Rosenfeld, J. Laser Appl., vol. 24, No. 4, Jul. 2012.*
(Continued)

*Primary Examiner* — Gordon Baldwin
*Assistant Examiner* — Mohammad Mayy
(74) *Attorney, Agent, or Firm* — Oliff PLC

(57) ABSTRACT

A microfabrication method is provided with which it is possible to easily form a fine periodic structure on a surface of any substrate. A glass precursor is applied to a substrate, and the glass precursor is irradiated with short-pulse laser light. By the irradiation with short-pulse laser light, the glass precursor is activated to undergo a thermal reaction, and a fine periodic structure can be easily formed on the surface. Furthermore, by oxidizing the substrate on which the fine periodic structure has been formed, the hue of the surface can be improved while maintaining the fine periodic structure.

12 Claims, 12 Drawing Sheets

(30) Foreign Application Priority Data

Jul. 26, 2013 (JP) ................................. 2013-155937
Jul. 26, 2013 (JP) ................................. 2013-155938

(51) Int. Cl.
*C03C 17/02* (2006.01)
*C03C 17/245* (2006.01)
*C03C 23/00* (2006.01)

(52) U.S. Cl.
CPC .. *C03C 2217/213* (2013.01); *C03C 2217/732* (2013.01); *C03C 2217/77* (2013.01); *C03C 2218/11* (2013.01); *Y10T 428/24355* (2015.01)

(56) References Cited

U.S. PATENT DOCUMENTS

| | | |
|---|---|---|
| 2001/0035991 A1 | 11/2001 | Hobbs et al. |
| 2004/0124184 A1 | 7/2004 | An et al. |
| 2004/0155017 A1 | 8/2004 | Hunt et al. |
| 2006/0173421 A1* | 8/2006 | Weber ............... A61M 25/0009 606/139 |
| 2006/0178014 A1 | 8/2006 | Moriya et al. |
| 2010/0006550 A1* | 1/2010 | Haight ................. B23K 26/362 219/121.85 |
| 2010/0148301 A1 | 6/2010 | Matsuda et al. |
| 2010/0301025 A1* | 12/2010 | Iwase ...................... H01S 3/123 372/15 |
| 2013/0146758 A1 | 6/2013 | Urban et al. |

FOREIGN PATENT DOCUMENTS

| | | |
|---|---|---|
| JP | 2003-171783 A | 6/2003 |
| JP | 2003-211400 A | 7/2003 |
| JP | 2006-235195 A | 9/2006 |
| JP | 2006-346748 A | 12/2006 |
| JP | 2010-142862 A | 7/2010 |
| JP | 2010-152296 A | 7/2010 |
| JP | 2011-221470 A | 11/2011 |
| JP | 2012-000828 A | 1/2012 |
| WO | 2011144743 A1 | 11/2011 |

OTHER PUBLICATIONS

Miyazaki K., et al., "Reflectivity in Femtosecond-laser-induced Structural Changes of Diamond-like Carbon Film," Applied Physics A, vol. 80 (2005), pp. 17-21.
Okamuro Kiminori et al., "Laser Fluence Dependence of Periodic Grating Structures Formed on Metal Surfaces Under Femtosecond Laser Pulse Irradiation," Physical Review B, vol. 82 (2010), pp. 165417-1-165417-5.
Oct. 8, 2013 International Search Report issued in International Patent Application No. PCT/JP2013/070383.
Jul. 28, 2016 Office Action issued in Chinese Patent Application No. 201380039750.3.
Oct. 24, 2016 Office Action issued in Japanese Patent Application No. 2013-155937.
"Subwavelength ripple formation on the surfaces of compound semiconductors irradiated with femtosecond laser pulses", A. Borowiec, and H. K. Haugen, APL, vol. 82, No. 25, (Year: 2003).
Oct. 13, 2017 Office Action issued in U.S. Appl. No. 14/417,466.
Feb. 22, 2018 Office Action Issued in U.S. Appl. No. 14/417,466.
Aug. 7, 2018 Office Action issued in U.S. Appl. No. 14/417,466.
Feb. 25, 2019 Office Action issued in U.S. Appl. No. 14/417,466.
Mar. 10, 2020 Office Action issued in U.S. Appl. No. 14/417,466.
Jul. 29, 2020 Office Action issued in U.S. Appl. No. 14/417,466.
Feb. 17, 2021 Office Action issued in U.S. Appl. No. 14/417,466.
Sep. 29, 2021 Notice Allowance issued in U.S. Appl. No. 14/417,466.
Jun. 13, 2019 Office Action issued in U.S. Appl. No. 14/417,466.

\* cited by examiner

MICROFABRICATION METHOD

CROSS-REFERENCE TO RELATED APPLICATION(S)

This application is a continuation of U.S. application Ser. No. 14/417,466 filed Jan. 16, 2015, which is a National Stage Entry of International Patent Application No. PCT/JP2013/070383 filed on Jul. 26, 2013, which is based on and claims priority under 35 U.S.C. 119 from Japanese Patent Application No. 2013-155938 filed on Jul. 26, 2013, Japanese Patent Application No. 2013-155937 filed on Jul. 26, 2013, Japanese Patent Application No. 2013-120978 filed on Jun. 7, 2013, and Japanese Patent Application No. 2012-165835 filed on Jul. 26, 2012. The contents of the above applications are incorporated herein by reference.

FIELD OF THE INVENTION

This invention relates to a method of microfabrication for creating a fine periodic structure on a surface.

DESCRIPTION OF THE PRIOR ART

Methods have been reported of forming nanostructures on metal surfaces (PLT 1, 2 and NPL 1) or semiconductor surfaces (PTL 3 or NPL 2) by irradiation with short pulse laser. In these methods, irradiation with laser light generates a surface wave on the target object and the interference between this surface wave and the laser light makes possible the formation of a periodic structure of approximately the same size as the light wavelength.

FIGS. 21 to 23 are cross-sectional views illustrating a method of creating a periodic structure on a metal surface by irradiation with a short pulse laser. As shown in FIG. 21, by irradiating a metal material 101 with a short pulse laser, the absorption of the laser light by the surface causes an uneven electron density distribution as shown in FIG. 22, and a surface plasmon with a period approximately the same as the light wavelength is generated. Subsequently, as shown in FIG. 23, coulomb explosion occurs in high electron density portions and a fine periodic structure is formed in the metal material 101.

Although this processing method can easily produce a periodic structure and microfabrication on a large surface area is possible, microfabrication on materials, such as glass, which are transparent to laser light, is not possible as a surface wave cannot be generated.

A method of nanofabrication of glass using lithography has been reported (see for example, PTL 4). Disappointedly, in this method, processes of resist deposition and exposure require high accuracy. Furthermore, applications of a fabrication target are limited as the fabrication target must be a flat plane without curvature. In addition, a large fabrication target dramatically increases the cost of apparatus.

Furthermore, PTL 5 discloses a method for drilling holes in a glass by applying pigment onto the surface, but the pigment must be removed.

CITATION LIST

Patent Literatures

PTL 1: Japanese Unexamined Patent Publication No. 2006-235195
PTL 2: Japanese Unexamined Patent Publication No. 2010-152296
PTL 3: Japanese Unexamined Patent Publication No. 2003-211400
PLT 4: Japanese Unexamined Patent Publication No. 2006-346748
PLT 5: Japanese Unexamined Patent Publication No. 2002-028799

Nonpatent Literature

NPL 1: K. Okamuro et.al. PhysRevB 82 165417 2010
NPL 2: G. Miyagi, ApplPhysA 80 17 2005

SUMMARY OF THE INVENTION

Problem to Be Solved by the Invention

In view of the foregoing, the object of this invention is to provide a microfabrication method wherein a fine periodic structure can easily be formed on a surface of any type of substrate.

Means for Solving the Problem

As a result of extensive studies, the inventors of the present invention have found that it is possible to easily form a fine periodic structure on a surface of any type of substrate by applying a glass precursor which absorbs light onto the substrate. In addition, an oxidizing process can improve the coloration of a fine periodic structure formed on a substrate while the micro periodic nature of said structure is maintained.

Thus, a microfabrication method according to the present invention includes an application step of applying a glass precursor onto a substrate and an irradiation step of irradiating a short pulse laser to the glass precursor.

Additionally, a microfabrication method according to the present invention includes an irradiation step of irradiating a short pulse laser to a glass precursor applied to a substrate and an oxidizing step of oxidizing a fine periodic structure formed by the irradiation step.

Effects of the Invention

As an effect of the present invention, in contrast to complicated processes such as lithography, a simple process of irradiation with a short pulse laser can easily form a fine periodic structure on a surface of any type of substrate. In addition, an oxidizing process can improve the coloration of a fine periodic structure formed on a surface of a substrate while the micro periodic nature of said structure is maintained.

DESCRIPTION OF EMBODIMENTS

Embodiments of this invention will now be described in detail according to the following order with reference to the attached drawings.
1. Microfabrication Method
1. 1 First Embodiment
1. 2 Second Embodiment
2. Structure
3. Examples
<1. Microfabrication Method>
[First Embodiment]

A first embodiment of this invention is a microfabrication method including an application step of applying a glass precursor onto a substrate and an irradiation step of irradiating a short pulse laser to the glass precursor. Each process will be explained hereinafter.

Figure 1:
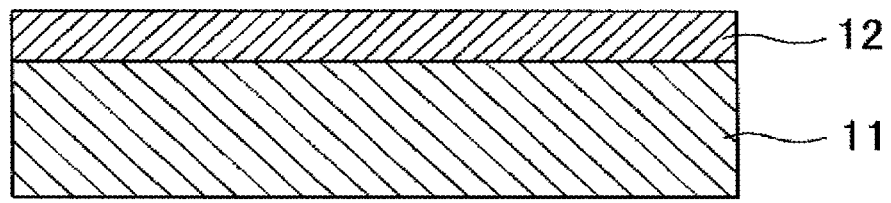
FIG. 1 is a schematic cross-sectional view illustrating an application step.

FIG. 1 is a schematic cross-sectional view illustrating the application step. In this application step, a glass precursor 12 is applied to a substrate 11.

Without any particular restrictions, the substrate 11 may be a transparent material or an opaque material. This embodiment employs a transparent material which transmits laser light; the transparent material is preferably a glass of the same quality as the glass into which the glass precursor 12 converts.

The material used as the glass precursor 12 has an unshared electron pair such as an amine group and a light absorbing molecular structure. Examples of the glass precursor 12 include perhydropolysilazane (PHPS), methylhydrosilazane (MHPS), and other polysilazanes with —(SiH$_2$NH)— as a base unit. In this embodiment, use of perhydrosilazane which converts to silica (SiO$_2$) having excellent optical properties is especially preferable.

Additionally, a catalyst such as a palladium catalyst or an amine catalyst may be added to the glass precursor 12. Additionally, such materials as xylene or dibutyl ether can be used as a solvent for the glass precursor 12. Additionally, roll coating, flow coating, spray coating or any other coating method can be employed as needed for applying the glass precursor 12. Additionally, the preferable thickness of application of the glass precursor 12 is 100 nm to 5 μm. An application thickness of the glass precursor 12 of less than 100 nm will make the formation of a fine periodic structure on a surface more difficult while an application thickness exceeding 5 μm might result in surface cracks.

Figure 2:
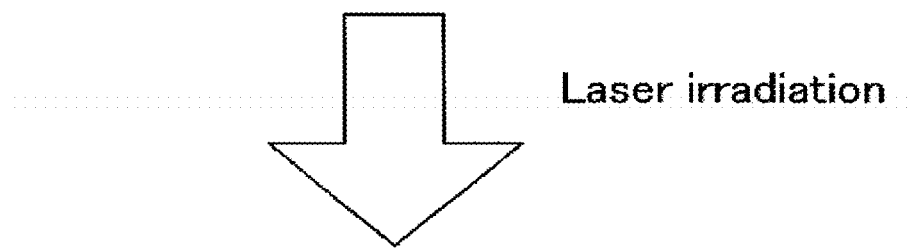
FIG. 2 is a schematic cross-sectional view illustrating an irradiation step.
Figure 3:
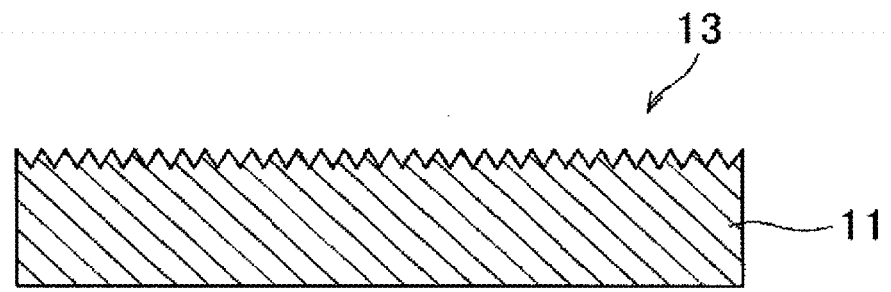
FIG. 3 is schematic cross-sectional view of microfabrication.

FIG. 2 is a schematic cross-sectional view illustrating the irradiation step. In the irradiation step, the glass precursor 12 is irradiated by a short pulse laser. Irradiation by a short pulse laser activates the unshared electron pairs of the glass precursor 12, proceeding to a thermal reaction, and, as shown in FIG. 3, a fine periodic structure 13 can be easily formed. Being converted into a glass trough irradiation by the short pulse laser, the glass precursor 12 remaining on the substrate 11 can serve as a glass coating.

Figure 4:
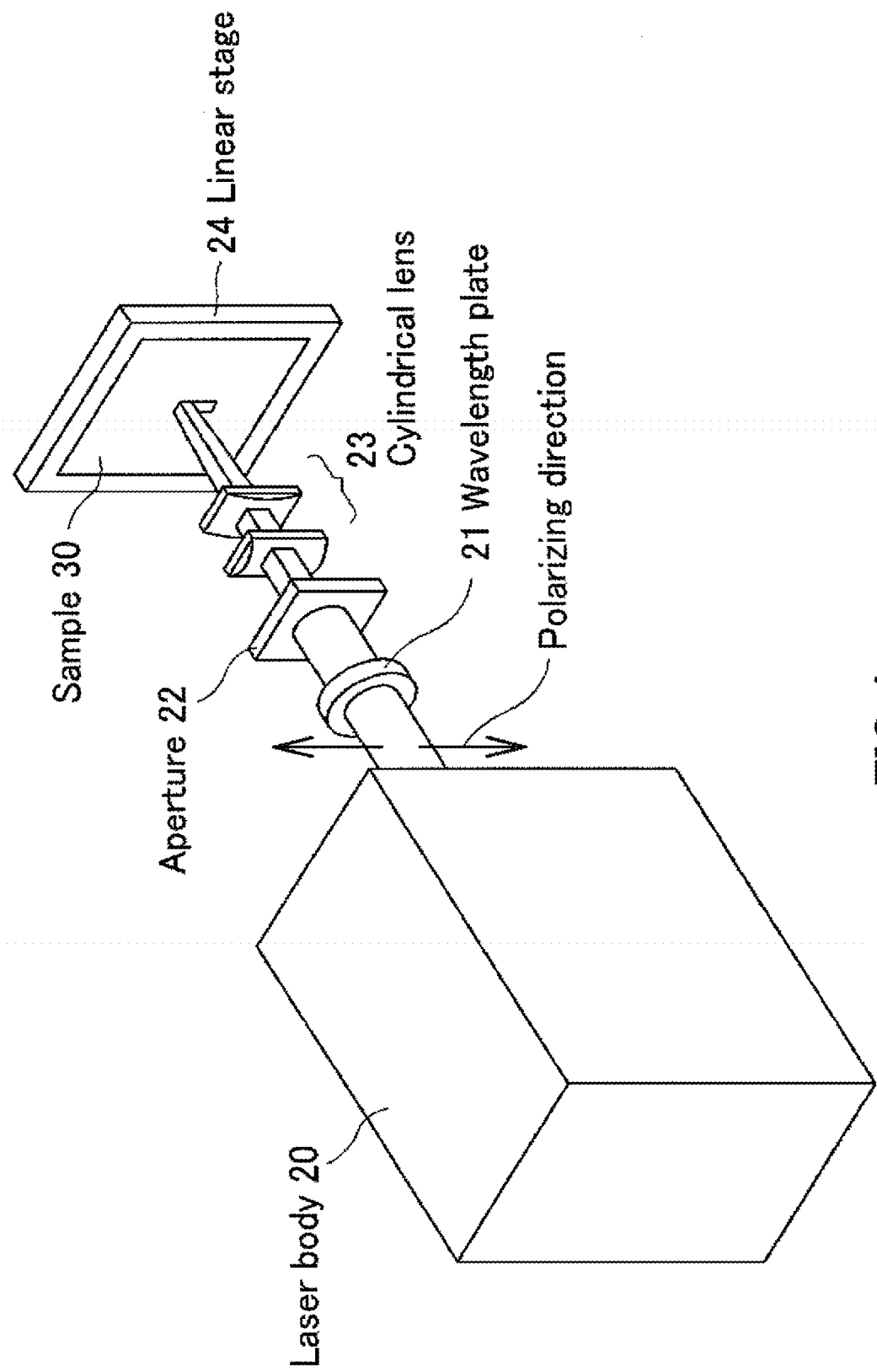
FIG. 4 is a schematic view of an optical apparatus for emitting a short pulse laser light.

FIG. 4 is a schematic view of an optical apparatus for emitting light from the short pulse laser. A laser body 20, for example, emits linearly polarized light in a perpendicular direction which is rotated by using a wavelength plate 21 ($\lambda/2$ wavelength plate) to obtain a linearly polarized light of a desired orientation. Additionally, light of a circular polarization can be obtained by using a $\lambda/4$ wavelength plate in place of a $\lambda/2$ wavelength plate. Additionally, in this apparatus, an aperture 22 having a quadrilateral opening extracts a portion of laser light. As the intensity distribution of the laser light determines the distribution of glass, the apparatus is configured to achieve a laser light having a uniform intensity distribution throughout a plane perpendicular to the laser beam by using only the central vicinity of a laser beam. Additionally, this apparatus uses two orthogonally oriented cylindrical lenses 23 to narrow the laser light to a desired beam size.

Using such an apparatus, the glass precursor 12 can be irradiated by an ultra-short pulse laser of a predetermined wavelength and a predetermined fluence to form a periodic structure of a size smaller than a predetermined wavelength in an area irradiated with laser light.

Fluence is energy density E/S (J/cm$^2$) where E (J) is the per pulse energy of the laser and where S (cm$^2$) is the area of the surface irradiated. The desired range of fluence varies according to material; however, a range of 0.01 J/cm$^2$ to 1.0 J/cm$^2$ is preferable and a range of 0.05 J/cm$^2$ to 0.5 J/cm$^2$ is more preferable. Additionally, while depending on the fluence and the depth of the periodic structure, the number of pulses is preferably fifty or more. Additionally, a short pulse length is preferable with a duration of 0.01 picoseconds to 100 picoseconds being preferable and a duration of 0.01 picoseconds to 5 picoseconds being more preferable. Additionally, in consideration of the processing time, a frequency of 1 kHz or higher is preferable. Additionally, a wavelength of, for example, 800 nm, 400 nm or 266 nm, can be chosen according to a desired periodic structure.

Additionally, a beam spot of a quadrilateral shape is preferable. It is possible to shape a beam spot with, for example, the aperture 22 or the cylindrical lens 23 among others. Additionally, the intensity of a beam spot is preferably as uniformly distributed as possible. For example, depth of the grooves to be formed can be made uniform within the surface plane in this manner. Assuming that the dimensions of the beam spot in the x axis direction and the y axis direction of the quadrilateral are Lx and Ly respectively, the laser is scanned in the y axis direction, and the length of Lx is 1/N (N is a natural number) of the x axis length of the area on which a periodic structure is to be formed, then the periodic structure can be formed by N scans. The length Ly can be approximately determined to be, for example, approximately 30 to 500 μm, according to stage speed, laser intensity, and pulse frequency among other conditions.

Additionally, after the irradiation step, it is preferable to raise the temperature of a periodic structure fabricated on a surface in a baking process. The temperature is preferably raised to approximately 200° C. to 1600° C. Such a baking process improves fineness, heat resistance, and translucency of fabricated material.

In the first embodiment of this invention, a microfabrication method, in contrast to complicated processes such as lithography, a simple process of irradiation with a short pulse laser allows the formation of nano-periodic structure on a surface. Additionally, as processing can be performed at normal temperature and normal pressure, processing can be performed on target objects with a large surface area and target objects free from limitations of curvature, application in a diversity of fields is possible.

[Second Embodiment]

A second embodiment of this invention is a microfabrication method including an application step of applying a glass precursor onto a substrate, an irradiation step of irradiating a short pulse laser to the glass precursor and an oxidizing step of oxidizing a fine periodic structure formed by the irradiation step.

The application step and the irradiation step in this embodiment are the same as described in the first embodiment of this invention and the explanation of the processes thereof are here omitted.

In the oxidizing step, a periodic structure fabricated on a surface is oxidized. Due to this, the color of a colored part of a fabricated micro periodic structure formed by irradiation with a short pulse laser can be improved. Oxidizing process includes, for example, annealing process, ultra violet light irradiation, plasma process, corona process, and the application of oxidizing agents among others.

The colored part of a micro periodic structure will be explained as follows. The colored part can be generated in a micro periodic structure created by irradiation of the glass precursor with a short pulse laser. In a cross-sectional elemental analysis, the inventors of the present invention have revealed that the colored parts are composed of Si or SiO.

Figure 5:
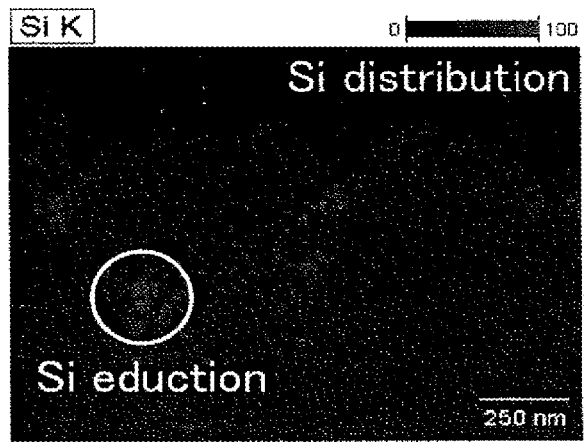
FIG. 5 is an image created by TEM-EDS showing Si distribution in a cross section of a colored fabricated material.
Figure 6:
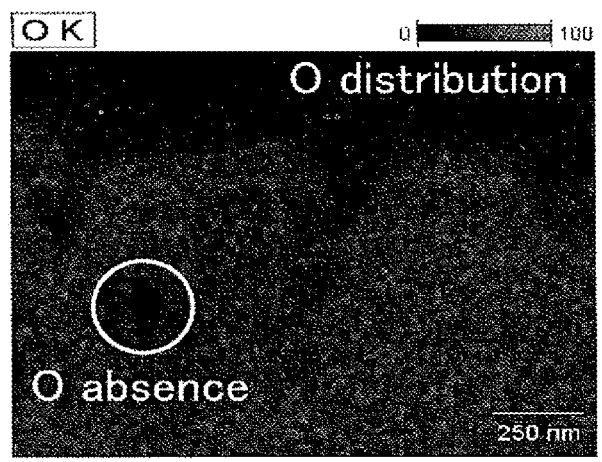
FIG. 6 is an image created by TEM-EDS showing O distribution in a cross section of a colored fabricated material.

FIG. 5 is a picture generated by TEM-EDS (transmission electron microscope energy-dispersive X-ray spectroscopy), showing Si distribution on a cross section of a colored fabricated material and FIG. 6 is a picture also generated by TEM-EDS, showing O distribution on a cross section of the colored fabricated material. The distribution of Si and O shows that within colored parts of a micro periodic structure, there are Si and SiO parts in which Si has been educed and O is lacking. It is thought that a reaction between PHPS (perhydropolysilazane) and $H_2O$ converts PHPS into $SiO_2$ and, at the time of this reaction, rapid energetic reaction caused by processing with a short pulse laser causes O coming from $H_2O$ to become insufficient and, as a result, Si or SiO are educed. The following chemical formula (1) shows a conversion reaction between PHPS and $H_2O$ which results in $SiO_2$ and chemical formulas (2) and (3) show a conversion reaction caused by the short pulse laser which results in Si and SiO, respectively.

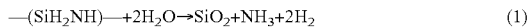  (1)

  (2)

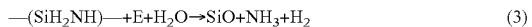  (3)

In this embodiment, Si or SiO in one or more colored parts are made to react by means of an oxidizing process in which one or more colored parts are made colorless. In the following chemical formulas (4) and (5), the oxidative reactions of Si or SiO are shown respectively.

  (4)

  (5)

In this embodiment, among the previously mentioned oxidizing processes, a simple annealing process may preferably be used. Temperature of annealing treatment is suitable if conditions for conversion into $SiO_2$ are present, it is preferable that the temperature be 200° C. or more and 1600° C. or less, and it is more preferable that the temperature be 300° C. or more and 550° C. or less. Overheating causes fine cracks to form. Furthermore, it is preferable that cooling be performed slowly. Rapid cooling can cause fine cracks.

Additionally, it is preferable that the annealing treatment be performed within an oxygenated atmosphere. This ensures the ability to make colored parts colorless. It should be noted that even in an atmosphere lacking oxygen, it is possible that colored parts may become transparent due to there being independently existing oxygen molecules and/or oxygen atoms within a processed micro periodic structure.

Colored parts can be made colorless by performing an annealing treatment in this manner on a micro periodic structure made by irradiating a glass precursor with a short pulse laser. Moreover, improvements can be made in fineness, heat resistance, and translucency of a fabricated material with properties of a fine periodic structure.

In the microfabrication method according to the present invention, in contrast to complicated processes such as lithography, a simple process of irradiation with a short pulse laser allows the formation of nano-periodic structure on a surface. Additionally, as processing can be performed at normal temperature and normal pressure, processing of target objects with a large surface area and target objects free from limitations of curvature can be performed which allows application in a diversity of fields. Furthermore, as improvement of the translucency of a structure with properties of a micro periodic structure is made, application in a diversity of fields is possible.

<2. Structure>

Next, structures formed into a periodic structure by the previously described microfabrication method will be explained. A surface of a structure according to this embodiment has linear or dotted protrusions of a periodic nature with a pitch between 50 nm and 1000 nm and a depth between 10 nm and 1000 nm. Additionally, as there is an appropriate fluctuation in pitch and angle of surface convexes and concaves, for example, it is possible to suppress generation of optical interference.

It is especially preferable that silica ($SiO_2$) be used as the substrate 11 and perhydropolysilazane be used as the glass precursor 12 which converts into silica such that a periodic structure can be formed on a glass surface more easily compared to conventional methods. Additionally, it is possible to implement structures formed into a periodic structure which have a reflectance of no more than 1% across the spectrum of visible light which is 300 nm to 800 nm. Because of this, it can be appropriately applied to automotive windshield glasses, surface glasses of heat absorbing tubes used in solar power generation, and optical components possessing antireflection functionality.

For example, in cases of use in automotive windshield glass, formation of a periodic structure on a surface improves the angle of contact with water where an angle of 90 degrees or more and more preferably at 110 degrees or more and 130 degrees or less makes possible achievement of excellent water repellant properties. Additionally, appropriately changing the depth of a periodic structure to minimize the contact angle of water and oil where an angle of 30 degrees or less and more preferably 15 degrees or less makes possible achievement of excellent hydrophilic properties. Furthermore, a periodic structure with a pitch of 350 nm or less makes possible conferment of antireflection functionality in the visible light spectrum.

Additionally, for example in the cases of use in substrate glass of thin film solar cells, formation of a periodic structure with a micro lattice having a pitch of approximately 0.5 μm makes possible efficient absorption of light at the peak wavelength of sunlight, which is in the vicinity of 0.5 μm.

Additionally, for example in the cases of use in optical components possessing antireflection functionality, by forming a structure with a period shorter than the wavelength of incoming light, antireflective functionality can be conferred and, due to an appropriate fluctuation of the period, generation of interference color can be suppressed.

Additionally, for example in the cases of use in surface glasses of heat absorbing tubes used in solar power generation, as reflectance of light in the visible light range is low, excellent heat absorption properties is achieved. Additionally, in contrast to UV imprint surface formation methods which are not heat resistant, it is possible to obtain excellent heat resistant properties.

EXAMPLES

<3. Examples>
[First Example]

Details of a first example of this invention are explained hereinafter. In a first example, a glass precursor was applied on a substrate and then the glass precursor was irradiated by a short pulse laser after which the surface was observed and an elemental analysis of microstructure was performed by using an FE-SEM: Field Emission-Scanning Electron Microscope (Hitachi Ltd model S-4700). It should be noted that this invention is not restricted by examples provided.

Example 1

A glass was used as a substrate and perhydropolysilazane was used as a glass precursor. Perhydropolysilazane was applied to the substrate and the side to which the perhydropolysilazane was applied was irradiated by a short pulse laser. The irradiation was performed under conditions in which fluence was 0.2 J/cm$^2$, irradiation pulse number was 70, pulse width was 200 fs, wave frequency was 1 kHz, wavelength was 390 nm, and dimensions of the beam spot were 300 μm by 120 μm.

Figure 7:
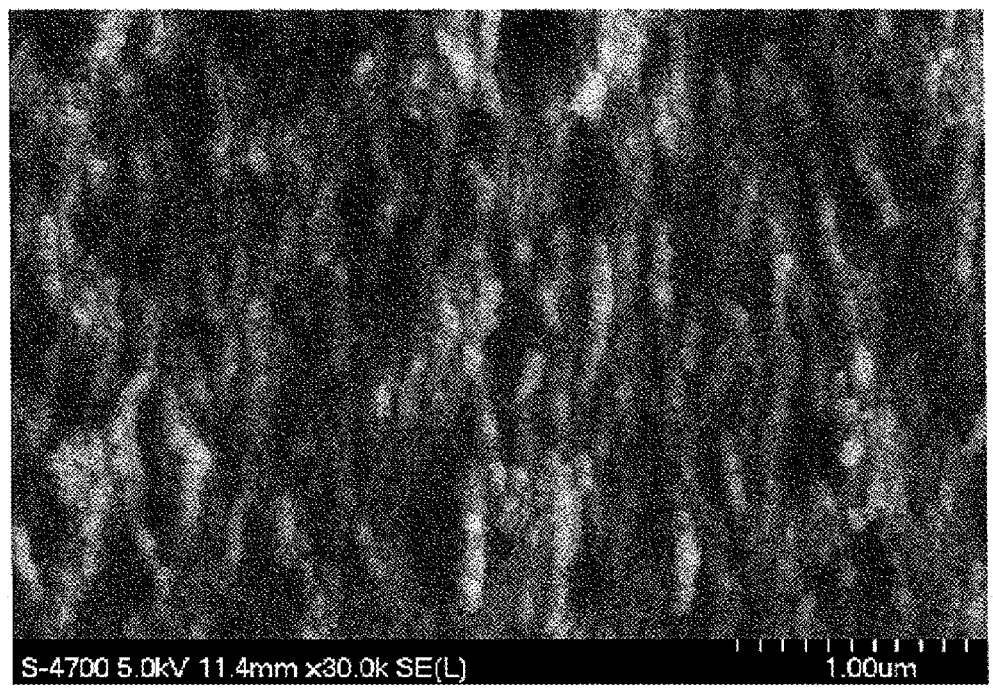
FIG. 7 is an image generated by SEM showing a processed surface of example 1.
Figure 8:
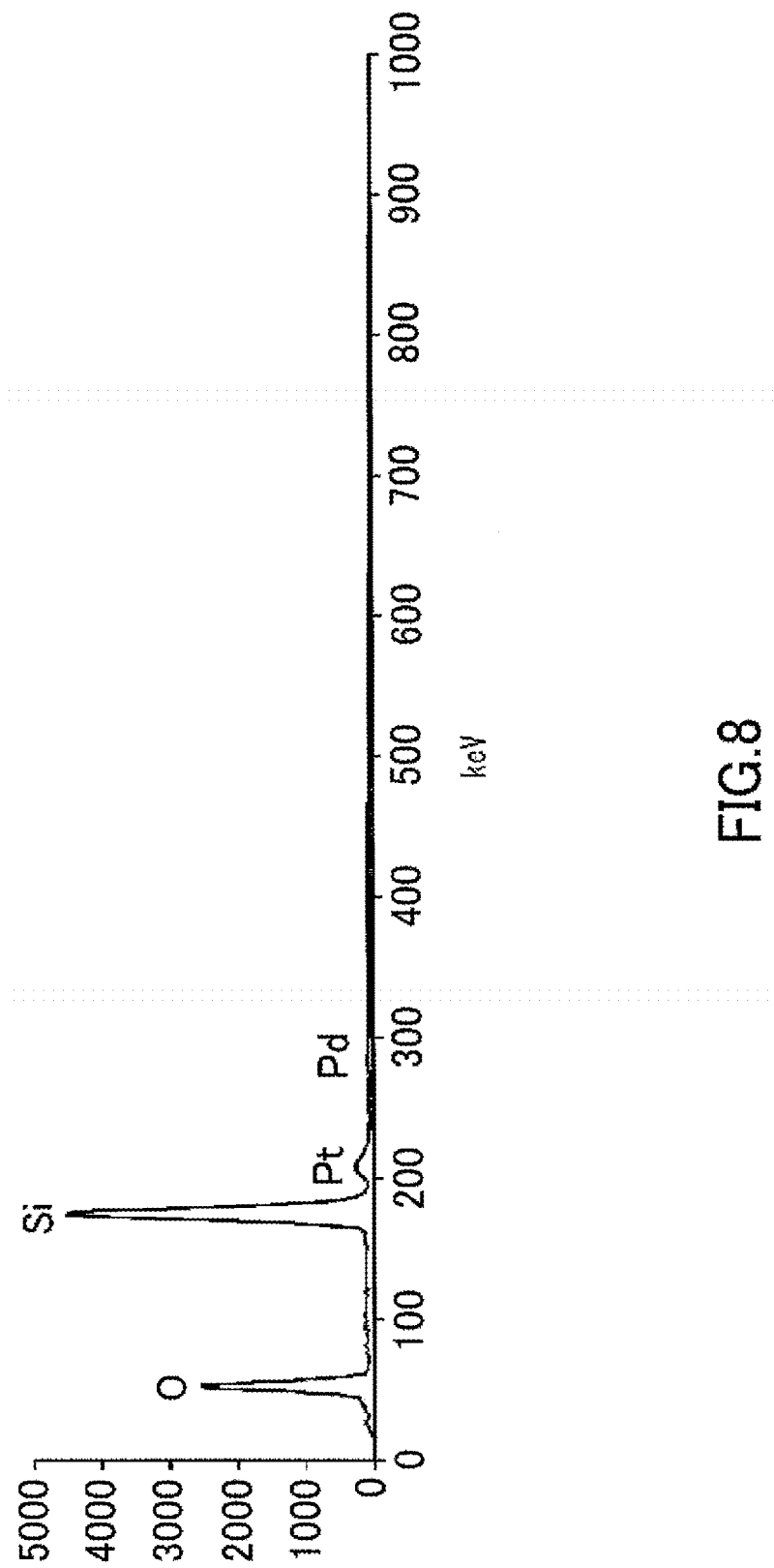
FIG. 8 is a graph showing elemental analysis data of a processed surface of example 1.

As shown in FIG. 7, an image generated by SEM, the formation of a microstructure having a period of approximately 100 nm could be confirmed. Additionally, in FIG. 8, which represents data from an elemental analysis, it was possible to confirm the complete conversion of perhydropolysilazane on the surface of the substrate into silica ($SiO_2$).

Example 2

Figure 9:
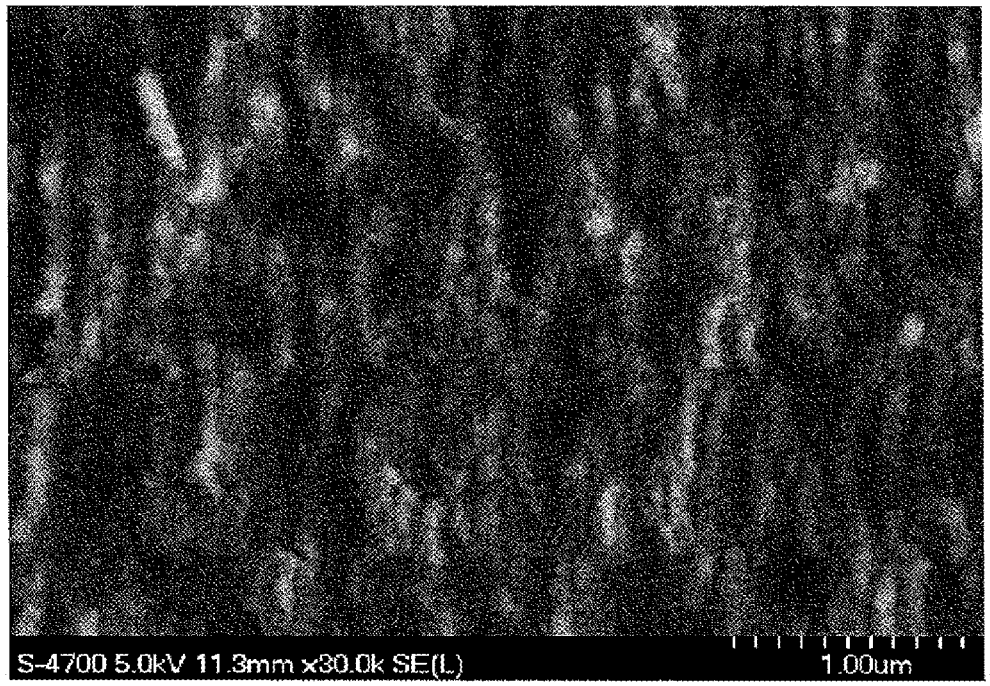
FIG. 9 is an image generated by SEM showing a processed surface of example 2.

Other than changing a condition of irradiation where irradiation pulse number was changed to 150, microfabrication in this example was performed in the same manner as example 1. As shown in FIG. 9, an image generated by SEM, the formation of a microstructure having a period of approximately 100 nm could be confirmed.

Example 3

Figure 10:
FIG. 10 is an image generated by SEM showing a processed surface of example 3.
Figure 11:
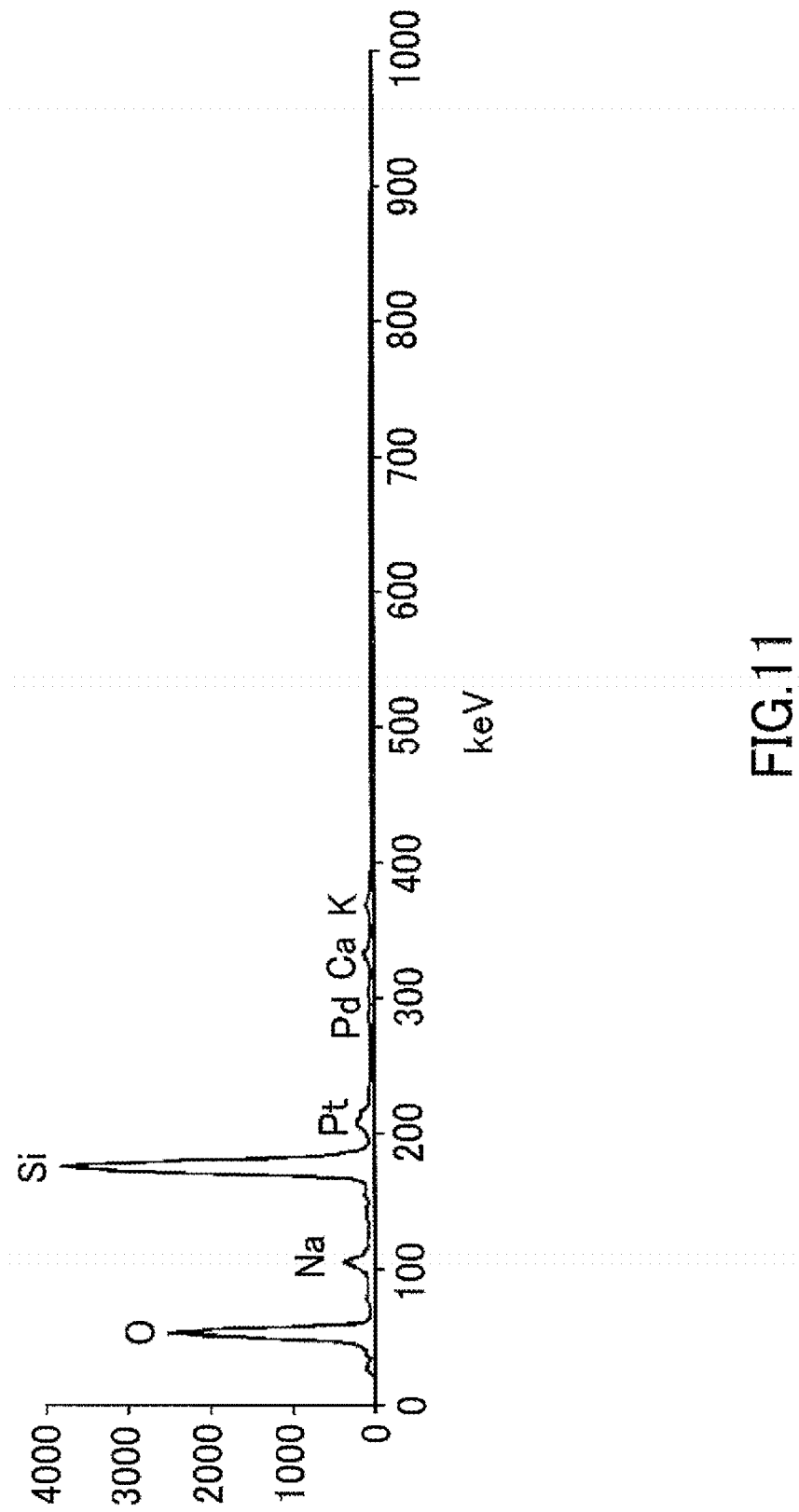
FIG. 11 is a graph showing elemental analysis data of a processed surface of example 3.

Other than changing a condition of irradiation where irradiation pulse number was changed to 300, microfabrication in this example was performed in the same manner as example 1. As shown in FIG. 10, an image generated by SEM, the formation of a microstructure having a period of approximately 100 nm could be confirmed. Additionally, in FIG. 11, a graph representing data from an elemental analysis, it was possible to confirm the complete conversion of perhydropolysilazane on the surface of the substrate into silica ($SiO_2$). It should be noted that Pt and Pd are sputter coatings for use in taking SEM measurements and can be ignored.

Comparative Example 1

Figure 12:
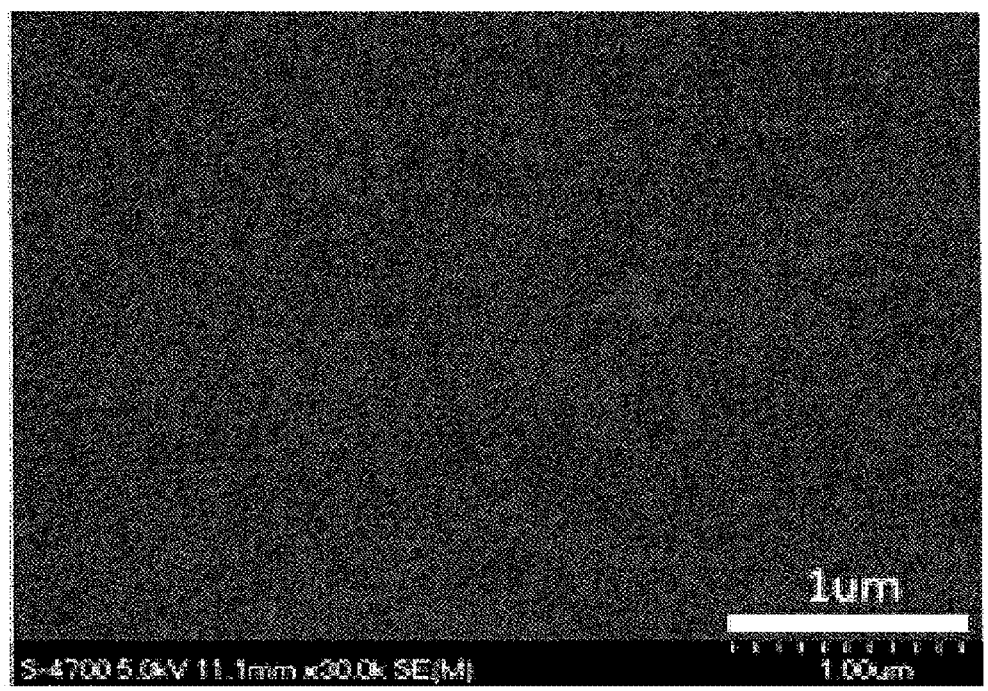
FIG. 12 is an image generated by SEM showing a processed surface of comparative example 1.

Other than not applying perhydropolysilazane to the substrate, microfabrication in this example was performed in the same manner as example 1. As shown in FIG. 12, an image generated by SEM, it was confirmed that a microstructure was not formed.

The above results revealed that by applying a glass precursor to a substrate and by irradiating the glass precursor with a short pulse laser, a periodic microstructure can be formed. Additionally, it was found that increasing the number of pulses increased the depth of the microstructure. Additionally, it was found that the glass precursor was completely converted to silica by irradiation with a short pulse laser.

[Measurement of Reflectance]

In the following, sample 1 of a white optical glass, sample 2 having an antireflective coating, and sample 3 having a microstructure formed on the surface were measured for reflectance and haze. Reflectance was measured with a reflectance measurement system (Jasco Corporation model V-670) in a wavelength range of 300 nm to 800 nm. Haze was measured using a haze meter (Murakami Color Research Laboratory model HM-150) in accordance with the standard JIS K 7136 and calculated by dividing scattered light transmittance by total light transmittance.

Figures 13, 14, 15:
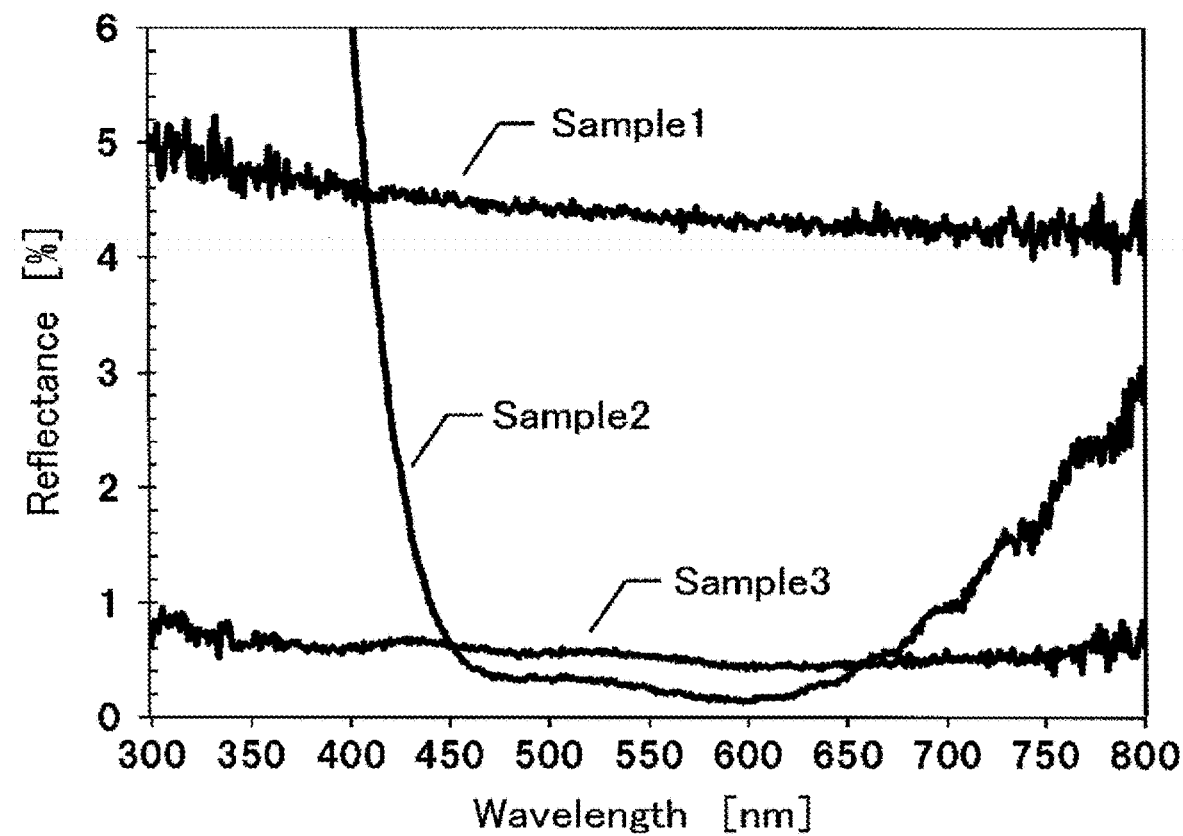
FIG. 13 is a graph showing reflectance of sample 1, sample 2 and sample 3.
FIG. 14 is a cross-sectional view of sample 1.
FIG. 15 is a cross-sectional view of sample 2.

FIG. 13 is a graph illustrating the reflectances of samples 1 to 3. As shown in FIG. 14, sample 1 is a white optical glass made of SiO2. Reflectance of sample 1 across a wavelength range of 300 nm to 800 nm was 4% or more and reflectance was 4.37% at a wavelength of 550 nm. Additionally, haze of the sample 1 was 0.2.

The sample 2 is comprised of a base material of PET (polyethylene terephthalate) which is laminated with a Dry-AR (Anti-reflection) layer as shown in FIG. 15. The Dry-AR layer reduces reflectance by forming a multi-layered film formed by a dry method and by utilizing optical interference. Additionally, a side of the PET material opposite to the Dry-AR layer side has been subjected to an AG (Anti-Glare)

process to form concaves and convexes which are utilized for light scattering. The sample 2 shows a reflectance of 1% or less across a wavelength range of 450 nm to 700 nm and a reflectance of 0.21% at a wavelength of 550 nm. However, in wavelengths exceeding 700 nm, reflectance exceeded 1%, reflectance exceeded 1% at wavelengths less than 450 nm, and reflectance was approximately 10% at a wavelength of 400 nm. Additionally, haze of the sample 2 was 3.0.

Figure 16:
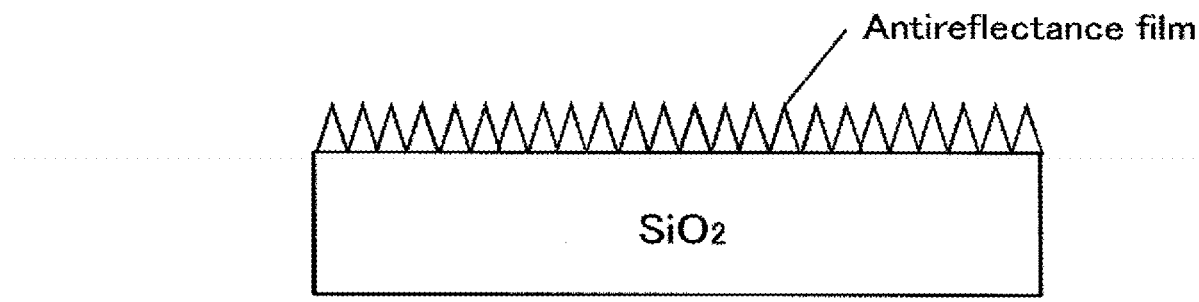
FIG. 16 is a cross-sectional view of sample 3.

The sample 3, as shown in FIG. 16, is a white optical glass having an antireflectance film consisting of a microstructure of a periodic nature formed on the surface thereof. The sample 3 is produced through the application of perhydropolysilazane to a white glass material which is then irradiated on the side of perhydropolysilazane application by a short pulse laser. Conditions of irradiation were a fluence of 0.2 J/cm$^2$, an irradiation pulse number of 70, a pulse width of 200 fs, a wave frequency of 1 kHz, a wavelength of 390 nm, and a beam spot dimension of 300 µm by 120 µm. Additionally, fabricated material was baked at a temperature of 550° C. for a period of 1 hour. Reflectance of the sample 3 across a wavelength range of 300 nm to 800 nm was shown to be 1% or less and reflectance was 0.52% at a wavelength of 550 nm. Additionally, haze of the sample 3 was 2.2.

From the above results, the sample 3, having a microstructure of a periodic nature formed upon the glass surface thereof and displaying a low reflectance across a wide band of wavelengths, is useful as an antireflection coating for optical components such as lenses.

[Second Example]

Below, details of a second example of this invention are explained. In a second example of this invention, a glass precursor was applied to a substrate which was then irradiated by a short pulse laser forming a microstructure to produce a sample which was then oxidized by heat process (annealing). It should be noted that this invention is not restricted by examples provided.

[Evaluation of Each Sample]

Total light transmittance of each sample was measured by using a haze meter (Murakami Color Research Laboratory model HM-150) in accordance with standard JIS K 7136. Additionally, reflectance of each sample was measured by using a reflectance measurement system (Jasco Incorporated model V-670) at a wavelength of 550 nm. The color and the presence or absence of cracks in each sample was evaluated by visual observation of each sample.

Example 11

Glass was used as a substrate and perhydropolysilazane was used as a glass precursor. Perhydropolysilazane was applied to the substrate which was then irradiated by a short pulse laser from the side opposite to the side of perhydropolysilazane application to produce a sample having a microstructure formed upon the surface thereof. Conditions of irradiation were a fluence of 0.2 J/cm$^2$, an irradiation pulse number of 70, a pulse width of 200 fs, a wave frequency of 1 kHz, a wavelength of 390 nm, and a beam spot dimension of 300 µm by 120 µm.

Figure 17:
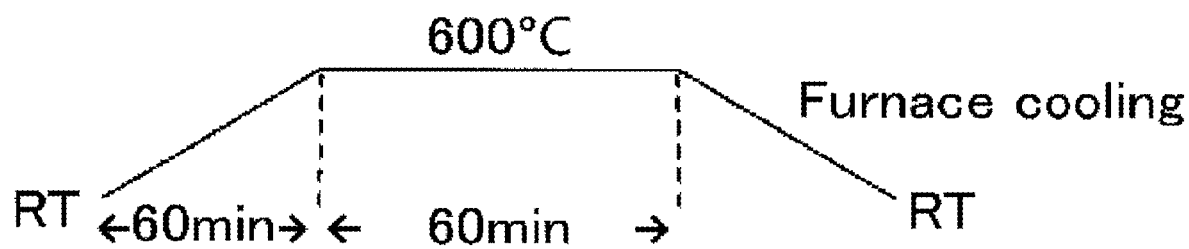
FIG. 17 illustrates a temperature profile of heat processing of example 1.

After the sample of example 11 was dried at room temperature for 24 hours, the sample was subjected to an annealing process under air atmosphere at a temperature of 600° C. for 1 hour. FIG. 17 is a temperature profile of the annealing treatment of example 1. Under air atmosphere, temperature was raised from room temperature to 600° C. during a period of 60 minutes, maintained at a temperature of 600° C. for 1 hour, and then temperature was allowed to cool to room temperature. After the annealing treatment, light transmittance of the sample was 92.1% and reflectance (550 nm) was 0.5%. Additionally, the sample was transparent and formation of cracks on the surface of the sample was observed.

Example 12

Other than that an annealing treatment was performed with the conditions of being under air atmosphere, at a temperature of 550° C., and having a duration of 2 hours, processing of the sample was performed in the same manner as example 11. Total light transmittance was 92.0% and reflectance (550 nm) was 0.5% after the annealing treatment. Additionally, the sample was transparent and formation of cracks on the surface of the sample was observed.

Example 13

Other than that an annealing treatment was performed with the conditions of being under air atmosphere, at a temperature of 550° C., and having a duration of 1 hour, processing of the sample was performed in the same manner as example 11. Total light transmittance was 92.1% and reflectance (550 nm) was 0.5% after the annealing process. Additionally, the sample was transparent and formation of cracks on the surface of the sample was not observed.

Figure 18:
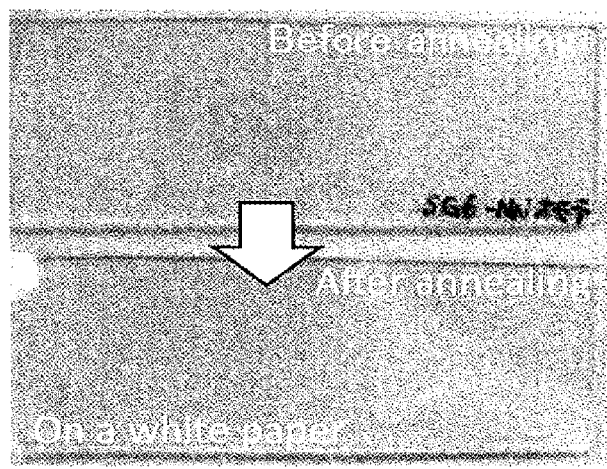
FIG. 18 is a photograph showing a sample of example 3 on a white paper before and after heat treatment.
Figure 19:
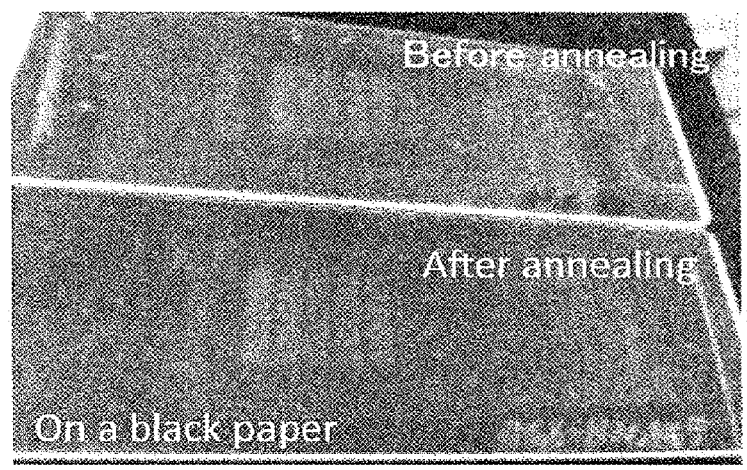
FIG. 19 is a photograph showing a sample of example 3 on a black paper before and after heat treatment.

FIG. 18 is a photograph of a sample of example 13 on a white paper before and after the annealing treatment and FIG. 19 is a photograph of a sample of example 13 on a black paper before and after the annealing treatment. As shown in FIGS. 18 and 19, the brownish coloring of the sample before the annealing treatment has become more transparent.

Example 14

Other than that an annealing treatment was performed with the conditions of being under air atmosphere, at a temperature of 500° C., and having a duration of 2 hours, processing of the sample was performed in the same manner as example 11. Total light transmittance was 92.1% and reflectance (550 nm) was 0.5% after the annealing treatment. Additionally, the sample was transparent and formation of cracks on the surface of the sample was not observed.

Example 15

Other than that an annealing treatment was performed with the conditions of being under air atmosphere, at a temperature of 500° C., and having a duration of 1 hour, processing of the sample was performed in the same manner as example 11. Total light transmittance was 92.1% and reflectance (550 nm) was 0.5% after the annealing treatment. Additionally, the sample was transparent and formation of cracks on the surface of the sample was not observed.

Example 16

Other than that an annealing treatment was performed with the conditions of being under air atmosphere, at a temperature of 400° C., and having a duration of 2 hours, processing of the sample was performed in the same manner example 11. Total light transmittance was 90.5% and reflectance (550 nm) was 0.5% after the annealing treatment. Additionally, the sample was of a light brownish color and formation of cracks on the surface of the sample was not observed.

Example 17

Other than that an annealing treatment was performed with the conditions of being under air atmosphere, at a temperature of 300° C., and having a duration of 2 hours, processing of the sample was performed in the same manner as example 11. Total light transmittance was 89.4% and reflectance (550 nm) was 0.7% after the annealing treatment. Additionally, the sample was of a light brownish color and formation of cracks on the surface of the sample was not observed.

Comparative Example 11

Other than that an annealing treatment was performed with the conditions of being under a nitrogen atmosphere, at a temperature of 500° C., and having a duration of 1 hour, processing of the sample was performed in the same manner as example 11. Total light transmittance was 88.5% and reflectance (550 nm) was 0.7% after the annealing treatment. Additionally, the sample was of a light brownish color and formation of cracks on the surface of the sample was not observed.

Figure 20:
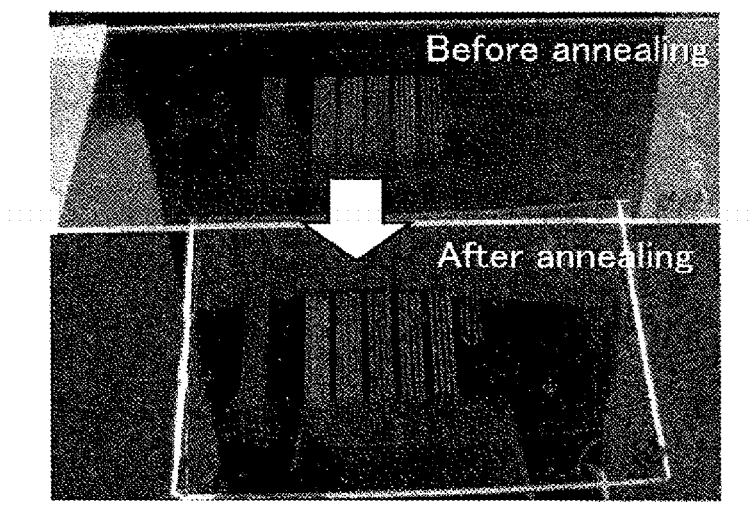
FIG. 20 is a photograph showing a sample of comparative example 1 on a black paper before and after heat treatment.
Figure 21:
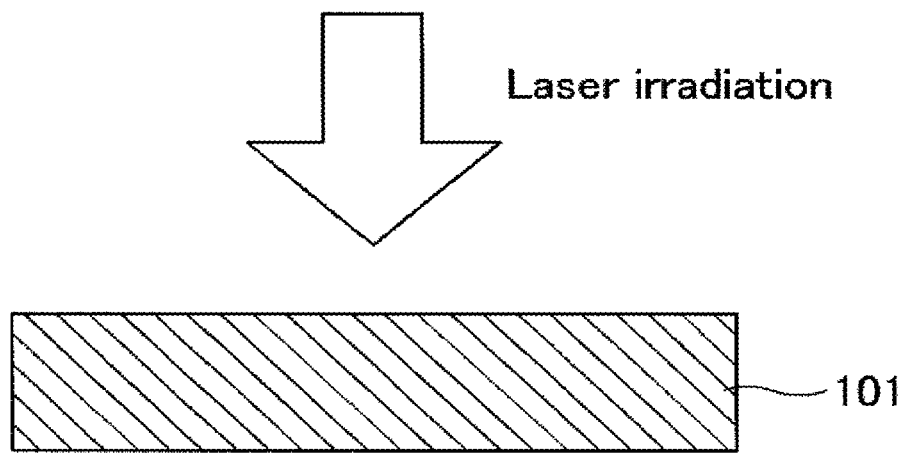
FIG. 21 is a schematic cross-sectional view of a metallic surface being irradiated with laser light.
Figure 22:
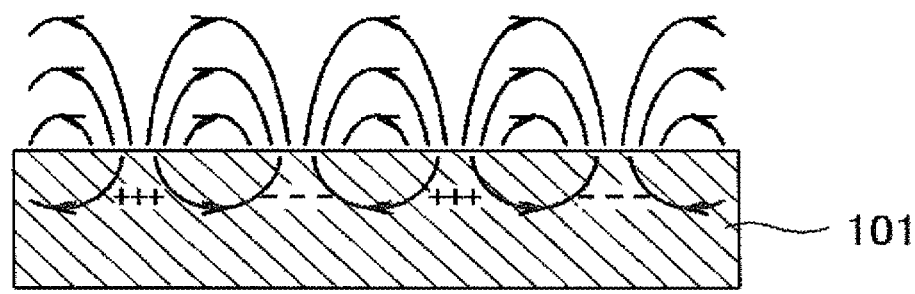
FIG. 22 is a schematic cross-sectional view of absorption of laser light by a metallic surface.
Figure 23:
FIG. 23 is a schematic cross-sectional view of microfabrication of a metallic surface.

FIG. 20 is a photograph of a sample of the comparative example 11 on a black paper before and after the annealing treatment. As shown in FIG. 20, the brownish color of the sample did not become transparent in the annealing treatment as oxygen in the atmosphere was insufficient.

Comparative Example 12

Other than that an annealing treatment was not performed, processing of the sample was performed in the same manner as example 11. Total light transmittance was 87.5% and reflectance (550 nm) was 0.8%. Additionally, the sample was of a brownish color and formation of cracks on the surface of the sample was not observed.

Results of evaluations of examples 11 to 16 and comparative examples 11 and 12 are shown in table 1.

TABLE 1

| | Glass precursor | | Annealing condition | | | Total light | Reflectance [%] | Color (visual | |
| | Material | Drying time | Atmosphere | Temperature | time [h] | transmittance [%] | (550 nm) | observation) | crack |
| --- | --- | --- | --- | --- | --- | --- | --- | --- | --- |
| Example 11 | Perhydro- | Room | Air | 600 | 1 | 92.1 | 0.5 | Transparent | Exist |
| Example 12 | polysilazane | temperature | | 550 | 2 | 92.0 | 0.5 | Transparent | Exist |
| Example 13 | | 24 h | | | 1 | 92.1 | 0.5 | Transparent | Not exist |
| Example 14 | | | | 500 | 2 | 92.1 | 0.5 | Transparent | Not exist |
| Example 15 | | | | | 1 | 92.1 | 0.5 | Transparent | Not exist |
| Example 16 | | | | 400 | 2 | 90.5 | 0.5 | Light brown | Not exist |
| Example 17 | | | | 300 | 2 | 89.4 | 0.7 | Light brown | Not exist |
| Comparative example 11 | | | Nitrogen | 500 | 1 | 88.5 | 0.7 | Brown | Not exist |
| Comparative example 12 | | | | | | 87.5 | 0.8 | Brown | Not exist |

As shown in examples 11 to 16, it was found that transparency can be improved while maintaining micro periodic structure properties by performing an oxidizing process. Additionally, as shown in examples 14 to 17, it was found that surface crack formation could be suppressed by an annealing temperature between 300° C. and 550° C.

EXPLANATION OF REFERENCES

11 substrate, 12 glass precursor, 13 periodic structure, 20 laser body, 21 wavelength plate, 22 aperture, 23 cylindrical lens, 24 linear stage, 30 sample, 101 metallic material

The invention claimed is:

1. A production method for an antireflection film comprising:
   applying a glass precursor onto a substrate;
   irradiating a single-beam short pulse laser to the glass precursor, and forming a silica layer having a periodic structure of a size smaller than a wavelength of the single-beam short pulse laser; and
   oxidizing the silica layer formed by irradiating the single-beam short pulse laser to the glass precursor, the periodic structure being transparent,
   wherein the glass precursor is polysilazane having —(SiH$_2$NH)— as a base unit, a pulse duration of the single-beam short pulse laser is between 0.01 picoseconds and 5 picoseconds, and a fluence range of the single-beam short pulse laser is 0.01 J/cm$^2$ to 1.0 J/cm$^2$,
   wherein the periodic structure has linear or dotted protrusions of a periodic nature with a pitch between 50 nm and 1000 nm and a depth between 10 nm and 1000 nm, and
   wherein the applying the glass precursor coats the glass precursor to a thickness of 100 nm to 5 μm.

2. The production method for an antireflection film according to claim 1, wherein the oxidizing of the silica layer is a heat treatment of the silica layer at a temperature of 300° C. to 550° C. in an oxygen atmosphere.

3. The production method for an antireflection film according to claim 1, wherein the oxidizing of the silica layer is a heat treatment of the silica layer at a temperature of 400° C. to 550° C. in an oxygen atmosphere.

4. The production method for an antireflection film according to claim 1, wherein the oxidizing of the silica layer increases a total light transmittance of the silica layer.

5. The production method for an antireflection film according to claim 1, wherein a fluence range of the single-beam short pulse laser is 0.05 J/cm$^2$ to 0.5 J/cm$^2$.

6. The production method for an antireflection film according to claim 1, wherein the silica layer has a reflectance of 1% or less in a wavelength range of 300 nm to 800 nm.

7. The production method for an antireflection film according to claim 1, wherein the substrate is a glass.

8. The production method for an antireflection film according to claim 1, the single-beam short pulse laser has a beam spot of a quadrilateral shape.

9. The production method for an antireflection film according to claim 1, wherein the silica layer has a contact angle with water of 110 degrees or more and 130 degrees or less.

10. The production method for an antireflection film according to claim 1, wherein the periodic structure has a pitch width of 350 nm or less.

11. The production method for an antireflection film according to claim 1, wherein the single-beam short pulse laser has a pulse number of 70 or more.

12. The production method for an antireflection film according to claim 8, wherein the single-beam short pulse laser has a length in a scanning direction of 30 to 500 μm.

* * * * *